United States Patent
Grachev et al.

(10) Patent No.: US 8,779,765 B2
(45) Date of Patent: Jul. 15, 2014

(54) METHOD FOR GENERATING SPIN WAVES

(75) Inventors: Dmitry Dmitrievich Grachev, Moscow (RU); Leonid Antonovich Sevastyanov, Moscow (RU)

(73) Assignees: Peoples Friendship University of Russia, Moscow (RU); Federal State Budgetary Institution "Federal Agency for Legal Protection of Military, Special and Dual Use Intellectual Activity Results", Moscow (RU)

( * ) Notice: Subject to any disclaimer, the term of this patent is extended or adjusted under 35 U.S.C. 154(b) by 0 days.

(21) Appl. No.: 13/996,859

(22) PCT Filed: Dec. 19, 2011

(86) PCT No.: PCT/RU2011/001000
§ 371 (c)(1),
(2), (4) Date: Jul. 23, 2013

(87) PCT Pub. No.: WO2012/087183
PCT Pub. Date: Jun. 28, 2012

(65) Prior Publication Data
US 2013/0293227 A1    Nov. 7, 2013

(30) Foreign Application Priority Data
Dec. 23, 2010    (RU) ................ 2010152733

(51) Int. Cl.
*G01V 3/00*    (2006.01)
(52) U.S. Cl.
USPC ........................................... 324/300
(58) Field of Classification Search
USPC ................................. 324/300–322
See application file for complete search history.

(56) References Cited

U.S. PATENT DOCUMENTS

| | | | | |
|---|---|---|---|---|
| 4,642,567 A | * | 2/1987 | Kaplan | 324/309 |
| 4,680,546 A | * | 7/1987 | Dumoulin | 324/307 |
| RE32,712 E | * | 7/1988 | Likes | 324/307 |

(Continued)

FOREIGN PATENT DOCUMENTS

| RU | 2363997 C1 | 8/2009 |
|---|---|---|
| RU | 2391747 C1 | 6/2010 |

OTHER PUBLICATIONS

International Search Report PCT/RU 20011/001000 Jun. 21, 2012.

(Continued)

*Primary Examiner* — Dixomara Vargas
(74) *Attorney, Agent, or Firm* — Abelman, Frayne & Schwab

(57) ABSTRACT

In the method, a pre-selected working area of a graphene film with a linear dimension of 2,000 nm, which working area is divided into sections having a dimension of 50-100 nm, is subjected to the effect of a pulsed alternating magnetic field with a frequency of 3 terahertz that corresponds to the transition from the ground energy level, corresponding to the non-excited state of spin density, to a fourth working energy level of the excited state of spin density in the graphene film, thus causing spin density pumping. A spatially localized external magnetic field is generated around the edges of the working area, which resonantly reflects spinons having a working frequency of 0.5-1 terahertz that corresponds to the transition from a third working energy level to a second working energy level of the excited state of spin density, said spinons causing the induced coherent radiation of working frequency spin waves as they pass thorough the working area.

1 Claim, 1 Drawing Sheet

(56) References Cited

U.S. PATENT DOCUMENTS

| | | | |
|---|---|---|---|
| 6,761,871 B2* | 7/2004 | Little | 423/447.3 |
| 7,528,456 B1* | 5/2009 | Khitun et al. | 257/421 |
| 7,535,070 B2* | 5/2009 | Eshaghian-Wilner et al. | 257/421 |
| 2002/0192141 A1* | 12/2002 | Little | 423/447.1 |
| 2006/0263674 A1* | 11/2006 | Hosoya et al. | 429/44 |

OTHER PUBLICATIONS

Wang, Y., Huang, Y., Song, Y., Zhang, X., Ma, Y., Liang, J., and Chen, Y. Room-Temperature Ferromagnetism of Graphene. Nano Lett. 9, 220-224 (2009).

D. V. Kolesnikov and V. A. Osipov The continuum gauge field-theory model for low-energy electronic states of icosahedral fullerenes, Joint Institute for Nuclear Research, Bogoliubov Laboratory of Theoretical Physics, arXiv:cond-mat/0510636,v2,2,Feb. 14, 2006.

Gusynin V. P. et al. "Unconventional Integer Quantum Hall Effect in Graphene". Phys., Rev. Lett. 95,146801,(2005), DOI:10.1103/PhysRevLett.95.146801.

Peres N. M. R., et. al. Electronic properties of disordered two-dimensional carbon Phys. Rev. B 73, 125411 (2006) DOI:10.1103/PhysRevB.73.125411.

Novoselov K. S. et al. "Two-dimensional gas of massless Dirac fermions in graphene", Nature 438, 197 (2005) DOI:10.1038/nature04233.

Zhang Y. et. al. "Experimental observation of the quantum Hall effect and Berry's phase in graphene" Nature 438, 201 (2005) DOI:10.1038/nature04235.

K. Ziegler Derealization of 2D Dirac Fermions: The Role of a Broken Supersymmetry. Phys. Rev. Lett. 80, 3113-3116 (1998).

J. Alicea. Matthew P. A. Fisher. Graphene integer quantum Hall effect in the ferromagnetic and paramagnetic regimes, Phys. Rev. B 74, 075422 (2006).

N. M. R. Peres, F. Guinea, A. H. Castro Neto. Coulomb interactions and ferromagnetism in pure and doped graphene. Physical Review B 72, 174406 (2005).

N. Tombros, C. Jozsa, M. Popinciuc, H. T. Jonkman, B. J. van Wees. Electronic spin transport and spin precession in single graphene layers at room temperature. arXiv:0706.1948, Nature 448, 571-574 (2007).

Nguyen Viet Hung, A. Bournel, P. Dollfus, Nguyen Van Lien. Spin-dependent transport in double ferromagnetic-gate graphene structures, Journal of Physics: Conference Series 187 (2009), 012037,doi:10.1088/1742-6596/187/1/012037.

G. M. Arzumanyan, E. A. Ayrjan, D. D. Grachev, L. A. Sevastianov. Quantum Field Model for Graphene Magnetism, 2014.

D. D. Grachev, L. A. Sevastianov. Quantum Field Model of the Ferromagnetism in Graphene Strucutures. Int. Conference of Theoretical Physics "Dubna-Nano2010", p. 63. Dubna, JINR, 2010.

* cited by examiner

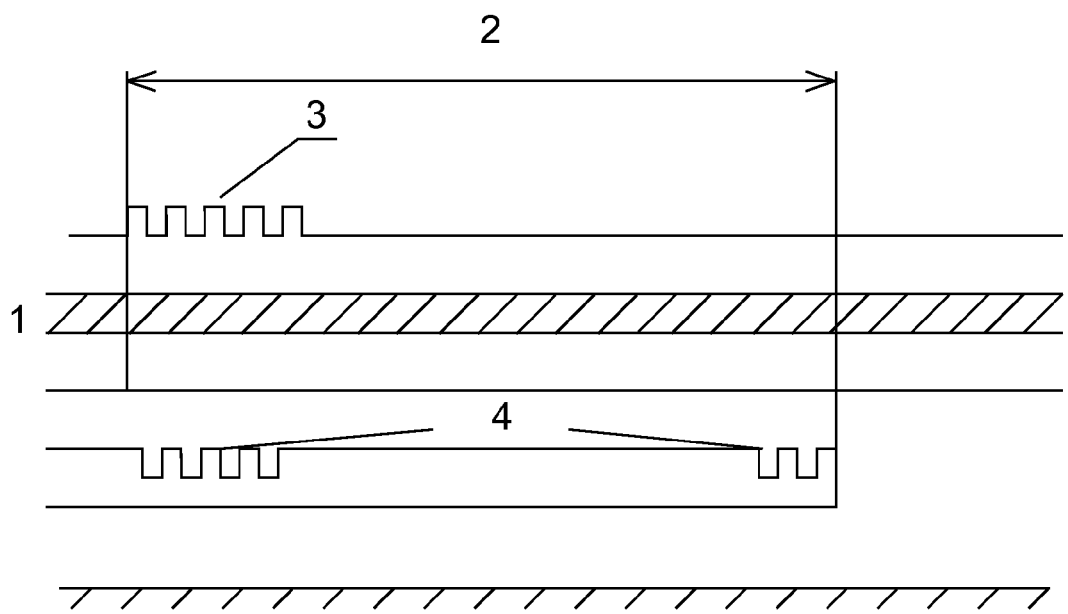

METHOD FOR GENERATING SPIN WAVES

CROSS REFERENCE TO RELATED APPLICATIONS

This application claims benefit under 35 U.S.C. §371 to international application no. PCT/RU2011/001000, filed on Dec. 19, 2011, which claims priority to Russian application No. RU 2010152733, filed on Dec. 22, 2010, the disclosures of which are incorporated by reference herein in their entireties.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable.

STATEMENT REGARDING PRIOR DISCLOSURES BY THE INVENTOR OR A JOINT INVENTOR

Not Applicable.

BACKGROUND OF THE INVENTION

1. Field of the Invention

The invention relates to the field of quantum physics of condensed media and, more particularly, to methods for forming quantum collective excitations of spin density and magnetization density in graphene films, and may be used in quantum nanoelectronics, spintronics, for creating spin-processors, memory cells, physical field sensors, other devices and systems for processing and storing information of terahertz (and higher) range that have nanometric dimensions and work in a broad temperature range with minimum energy consumption.

2. Description of Related Art Including Information Disclosed Under 37 CFR 1.97 and 1.98

Graphene, which is a monoatomic two-dimensional hexagonal lattice of carbon atoms, is considered as one of basic materials for creating a circuitry of nanoelectronic spintronic devices and systems that ensure a several-digits gain in the fields of speed, dimensions and energy consumption as compared to microelectronic analogous solutions. This is conditioned by the fact that a ferromagnetic effect has been observed experimentally and discussed theoretically in such a structure in a broad temperature range (from several degrees to 500 K), which effect proves that graphene structures may have intrinsic magnetization conditioned by non-zero spin density of atom valence electrons that is distributed over two-dimensional carbon lattice [Wang, Y., Huang, Y., Song, Y., Zhang, X., Ma, Y., Liang, J., and Chen, Y. Room-Temperature Ferromagnetism of Graphene. Nano Leu. 9, 220-224 (2009)], [D. V. Kolesnikov and V. A. Osipov The continuum gauge field-theory model for low-energy electronic states of icosahedral fullerenes, Joint Institute for Nuclear Research, Bogoliubov Laboratory of Theoretical Physics, arXiv:cond-mat/0510636,v2,2,Feb,2006.14], [Gusynin V. P. et al. "Unconventional Integer Quantum Hall Effect in Graphene". Phys., Rev. Lett. 95, 146801, (2005), DOI:10.1103/PhysRevLett.95.146801], [Peres N.M.R., et. al. Electronic properties of disordered two-dimensional carbon Phys. Rev. B 73, 125411 (2006) DOI:10.1103/PhysRevB.73.125411], [Novoselov K. S. et al. "Two-dimensional gas of massless Dirac fermions in graphene", Nature 438, 197 (2005) DOI:10.1038/nature04233], [Zhang Y. et. al. "Experimental observation of the quantum Hall effect and Berry's phase in graphene" Nature 438, 201 (2005) DOI:10.1038/nature04235], [K. Ziegler Derealization of 2D Dirac Fermions: The Role of a Broken Supersymmetry. Phys. Rev. Lett. 80, 3113-3116 (1998)], [J. Alicea. Matthew P. A. Fisher. Graphene integer quantum Hall effect in the ferromagnetic and paramagnetic regimes, Phys. Rev. B 74, 075422 (2006)], [N.M.R. Peres, F. Guinea, A. H. Castro Neto. Coulomb interactions and ferromagnetism in pure and doped graphene. PHYSICAL REVIEW B 72, 174406 (2005)], [N. Tombros, C. Jozsa, M. Popinciuc, H. T. Jonkman, B. J. van Wees. Electronic spin transport and spin precession in single graphene layers at room temperature. arXiv:0706.1948, Nature 448, 571-574 (2007)], [Nguyen Viet Hung, A. Bournel, P. Dollfus, Nguyen Van Lien. Spin-dependent transport in double ferromagnetic-gate graphene structures, Journal of Physics: Conference Series 187 (2009), 012037,doi:10.1088/1742-6596/187/1/012037], [D. D. Grachev, Yu. P. Rybakov, L. A. Sevastianov, Ye. F. Sheka "Ferromagnetism in graphene and fullerene nanostructures. Theory, simulation, experiment." M. UDN Newsletter, 2010], [G. M. Arzumanyan, E. A. Ayrjan, D. D. Grachev, L. A. Sevastianov. Quantum Field Model for Graphene Magnetism], [D. D. Grachev, L. A. Sevastianov. Quantum Field Approach to the Ferromagnetic Properties of the Graphene Films. Int. Conference of Theoretical Physics "Dubna-Nano2010", p. 63. Dubna, JINR, 2010].

The availability of this non-zero spin density enables to control its distribution with the use of various physical fields, and this forms a basis for creating spintronic elements and devices. For creating such devices it is necessary to form local excitations of spin density, which are subjected to a control action.

A method is known that is used for forming spin waves by tunneling spin-polarized electrons to a graphene film from a cobalt electrode through a dielectric insulating film [N. Tombros, C. Jozsa, M. Popinciuc, H. T. Jonkman, B. J. van Wees. Electronic spin transport and spin precession in single graphene layers at room temperature. arXiv:0706.1948, Nature 448, 571-574 (2007)].

Injected electrons form spin spatially localized pulses that later propagate and relax in a graphene film. During measurements local magnetic resistance and precession of injected spins in an external magnetic field are registered. A relaxation time is about 100 picoseconds, and a relaxation length is about 1-2 microns.

A limitation of this known method is the absence of quantum coherence of spin pulses formed, this restricts their lifetime and length of relaxation on a graphene surface, which are important for various practical applications.

BRIEF SUMMARY OF THE INVENTION

The present invention is based on the task of increasing lifetime and propagation length of spin pulses in a graphene film and, thus improving performance.

In order to solve the set task and achieve the said technical result, a pre-selected working area of a graphene film with a linear dimension of 2,000 nm, which working area is divided into sections having a dimension of 50-100 nm, is acted on with a pulsed alternating magnetic field having a frequency of 3 terahertz that corresponds to the transition from the ground energy level corresponding to the non-excited state of spin density to the fourth working energy level of the excited state of spin density in the graphene film, thus causing energy pumping of spin density, a spatially localized external magnetic field being formed at the edges of the working area, which resonantly reflects spinons having a working frequency of 0.5-1 terahertz corresponding to the transition from the third working energy level to the second working energy level of the excited state of spin density, and the said spinons, when they pass through the working area, cause induced coherent emission of working frequency spin waves.

The working body for such quantum generation is a graphene film itself, which, due to interaction non-linearity of spatially localized spin-density solitons in graphene, has a local minimum ensuring the availability of discrete values for the solution spectrum of the Schrödinger equation for the wave function of a system of interacting spin solitons with a corresponding value of intrinsic energy for each solution.

A graphene film is a medium having a discrete spectrum of spin density excited states, quantum transitions between which are accompanied by emission or absorption of spin-density elementary excitation quantum referred to as spinon. The resonator that ensures generation are magnetic field configurations formed by external devices on the surface of a graphene film, which are referred to as magnetic mirrors and reflect spinons.

Increases in lifetime and propagation length of a spin pulse are achieved due to the fact that such a spin pulse is formed by a flow of quantum-coherent spin waves (spin wave quantum oscillator referred to as "spinaser").

BRIEF DESCRIPTION OF THE SEVERAL VIEWS OF THE DRAWING

The FIGURE illustrates a cross-sectional view illustrating the functionalized graphene layer, working area, pumping structure, and magnetic mirrors.

DETAILED DESCRIPTION OF THE INVENTION

The method can be carried out as follows. By using a control structure referred to as a pumping structure 3 (planar magnetic coil) alternating magnetic field pulses having an amplitude 1-5 T are formed, which magnetic field is spatially configured for forming stationary excited states of spin density in pre-determined 50-100 nm areas of a graphene film 1. Thus, pumping is carried out. The pumping layout having four successive energy spinon levels (four-level layout) is selected as the working one. At the same time, external magnetic field configurations that are spatially localized in the working area 2 of 2,000 nm and reflect spinons of pre-determined energy and pulse, which are referred to as magnetic mirrors 4, are formed along the edges of the working area 2 having the linear dimension of 100 microns. These configurations are 50 nm regions of magnetic field spatial modulation that form diffraction mirrors for spinons, reflect spinons of pre-determined energy and pulse and have transparency windows for other spinons. Said magnetic mirrors 4 form a resonator analogous to the Fabry-Perot resonator for electromagnetic waves of optical range. Working values of magnetic field strength in the pumping layout and the control structure are in the range from 1 to 5 T.

Excited, spatially localized, stationary states of spin density, i.e., breathers, are formed in the working area 2 of a graphene film 1 in the result of pumping [D. D. Grachev, Yu. P. Rybakov, L. A. Sevastianov, Ye. F. Sheka "Ferromagnetism in graphene and fullerene nanostructures. Theory, simulation, experiment. M. UDN Newsletter, 2010], [G. M. Arzumanyan, E. A. Ayrjan, D. D. Grachev, L. A. Sevastianov. Quantum Field Model for Graphene Magnetism], [D. D. Grachev, L. A. Sevastianov. Quantum Field Approach to the Ferromagnetic Properties of the Graphene Films. Int. Conference of Theoretical Physics "Dubna-Nano2010", p. 63, Dubna, JINR, 2010].

Breathers have spatial dimensions of 20-100 nm, depending on their energy, and are on the top, fourth energy level from where they spontaneously pass to the metastable third energy level, emitting spinons for which magnetic mirrors 4 are transparent. The lifetime of a breather at the third energy level is 10 times greater than that at the second level, which provides the possibility of creating inverse population of breathers between the third and the second levels. During spontaneous transitions from the second to the first energy levels spinons are emitted for which magnetic mirrors 4 are also transparent. Thus, resonant conditions are ensured only for spinons emitted in the result of working transitions from the third to the second energy levels between which an inverse density of breather population is created. When such a spinon passes the working area 2 in the result of its interaction with breathers being at the third metastable energy level, the breathers forcedly and coherently emit a similar spinon, passing to the second working energy level from where they spontaneously pass to the first, ground level. As a result, we obtain the quantum amplification effect of a coherent spinon flow. The magnetic mirrors 4 ensure multiple increase of an amplification coefficient. The multiplicity equals to the number of flow passes between the mirrors and is 10-100.

Thus, when the amplification coefficient exceeds the sum of the absorption coefficient and the scattering coefficient, quantum generation of a spinon coherent flow is ensured, and, in the result, the lifetime of spin pulses increases 100 times and the length of their propagation increases 1,000 times in comparison with the prototype using non-coherent pulses.

The claimed method for forming spin waves in graphene films may be most successfully used on an industrial scale in quantum nanoelectronics and spintronic.

What is claimed is:

1. A method for forming spin waves in a graphene film, comprising:
    selecting a working area of the graphene film having a linear dimension of 2,000 nm,
    dividing the working area into sections having a dimension of 50-100 nm,
    applying a pulsed alternating magnetic field from a pumping structure to the working area having a frequency of 3 terahertz that corresponds to the transition from the ground energy level corresponding to the non-excited state of spin density to the fourth working energy level of the excited state of spin density in the graphene film,
    wherein energy pumping of spin density is caused,
    wherein a spatially localized external magnetic field is formed at the edges of the working area,
    wherein spinons are resonantly reflected having a working frequency of 0.5-1 terahertz corresponding to the transition from the third working energy level to the second working energy level of the excited state of spin density, and wherein the spinons, when they pass through the working area, cause induced coherent emission of working frequency spin waves.

* * * * *